US011699709B2

(12) United States Patent
Ma et al.

(10) Patent No.: US 11,699,709 B2
(45) Date of Patent: Jul. 11, 2023

(54) ARRAY SUBSTRATE, DISPLAY PANEL, AND DISPLAY DEVICE

(71) Applicants: Beijing BOE Display Technology Co., Ltd., Beijing (CN); BOE TECHNOLOGY GROUP CO., LTD., Beijing (CN)

(72) Inventors: Zhiqiang Ma, Beijing (CN); Tingting Wang, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/515,246

(22) Filed: Oct. 29, 2021

(65) Prior Publication Data

US 2022/0278138 A1   Sep. 1, 2022

(30) Foreign Application Priority Data

Feb. 26, 2021 (CN) .......................... 202110219057.0

(51) Int. Cl.
  *G02F 1/1339* (2006.01)
  *H01L 27/12* (2006.01)
  *G02F 1/1368* (2006.01)

(52) U.S. Cl.
  CPC ........ *H01L 27/1244* (2013.01); *G02F 1/1339* (2013.01); *G02F 1/1368* (2013.01); *H01L 27/1259* (2013.01)

(58) Field of Classification Search
  CPC ............ H01L 27/1244; H01L 27/1259; G02F 1/1368; G02F 1/1339
  See application file for complete search history.

(56) References Cited

U.S. PATENT DOCUMENTS

2011/0134352 A1* 6/2011 Nakagawa ............ G02F 1/1345
  349/43
2018/0292692 A1* 10/2018 Du .................... G02F 1/136286

FOREIGN PATENT DOCUMENTS

CN          106252418 A    12/2016

* cited by examiner

*Primary Examiner* — James A Dudek
(74) *Attorney, Agent, or Firm* — Houtteman Law LLC

(57) ABSTRACT

The present disclosure provides an array substrate, a display panel, and a display device. The array substrate includes: a substrate; and a first conductive structure, an interlayer insulation layer, and a second conductive structure sequentially disposed on the substrate. The first conductive structure has a first connection portion, the second conductive structure has a second connection portion, and the first connection portion is electrically coupled to the second connection portion through a via penetrating through the interlayer insulation layer. At least one of the first connection portion and the second connection portion is provided with an opening, and an orthographic projection of the opening on the substrate does not overlap an orthographic projection of the via on the substrate.

15 Claims, 5 Drawing Sheets

ARRAY SUBSTRATE, DISPLAY PANEL, AND DISPLAY DEVICE

CROSS-REFERENCE TO RELATED APPLICATION

The present application claims priority from Chinese patent application No. 202110219057.0 filed on Feb. 26, 2021, the entirety of which is incorporated herein by reference.

TECHNICAL FIELD

The present disclosure relates to the field of display technologies, in particular to an array substrate, a display panel, and a display device.

BACKGROUND

With the continuous progress of display technologies, liquid crystal display (LCD) panels have been applied to display devices such as mobile phones, computers, tablet computers, and smart televisions.

In the process of producing a LCD panel, when an array substrate is aligned and assembled with a color filter (CF) substrate, an ultraviolet (UV) curing operation is required. Generally, when the UV curing operation is performed, the LCD panel is irradiated with ultraviolet light from the array substrate side. Since a planar conductive portion with a large area in the array substrate may block out the ultraviolet light, the intensity of the ultraviolet light is weakened, and an ultraviolet curing adhesive irradiated by the ultraviolet light with weakened intensity is not completely cured, so that problems such as leakage of liquid crystal, infiltration of external moisture into the LCD panel, and the like may be caused.

SUMMARY

Embodiments of the present disclosure provide an array substrate, including:

a substrate; and a first conductive structure, an interlayer insulation layer, and a second conductive structure sequentially disposed on the substrate, wherein the first conductive structure has a first connection portion, the second conductive structure has a second connection portion, and the first connection portion is electrically coupled to the second connection portion through at least one via penetrating through the interlayer insulation layer; and at least one of the first connection portion and the second connection portion is provided with an opening, and an orthographic projection of the opening on the substrate does not overlap an orthographic projection of the via on the substrate.

In some embodiments, the first connection portion includes a plurality of first sub-connection portions coupled to each other, and the opening is between any adjacent ones of the plurality of first sub-connection portions;

the at least one via comprises a plurality of vias; and each of the plurality of first sub-connection portions is electrically coupled to the second connection portion through a corresponding one of the plurality of vias.

In some embodiments, the second connection portion includes a plurality of second sub-connection portions coupled to each other, and the opening is between any adjacent ones of the plurality of second sub-connection portions;

the at least one via comprises a plurality of vias; and each of the plurality of second sub-connection portions is electrically coupled to the first connection portion through a corresponding one of the plurality of vias.

In some embodiments, the first connection portion includes a plurality of first sub-connection portions coupled to each other;

the second connection portion includes a plurality of second sub-connection portions coupled to each other;

the opening includes a first opening between any adjacent ones of the plurality of first sub-connection portions and a second opening between any adjacent ones of the plurality of second sub-connection portions;

the at least one via comprises a plurality of vias; and each of the plurality of first sub-connection portions is electrically coupled to a corresponding one of the plurality of second sub-connections through a corresponding via of the plurality of vias.

In some embodiments, the first conductive structure includes a power supply voltage signal line having the first connection portion;

the second conductive structure includes a first signal connection line having the second connection portion; and the first connection portion of the power supply voltage signal line is electrically coupled to the second connection portion of the first signal connection line through the via, and the first signal connection line is electrically coupled to an electrostatic discharge structure.

In some embodiments, the first conductive structure includes a common electrode line having the first connection portion;

the second conductive structure includes a second signal connection line having the second connection portion; and the first connection portion of the common electrode line is electrically coupled to the second connection portion of the second signal connection line through the via.

In some embodiments, the array substrate further includes:

a thin film transistor, wherein the first conductive structure includes an active layer of the thin film transistor, and the active layer of the thin film transistor includes the first connection portion;

the second conductive structure includes a source electrode and a drain electrode of the thin film transistor, and each of the source electrode and the drain electrode of the thin film transistor includes the second connection portion; and the first connection portion of the active layer is electrically coupled to the second connection portion of each of the source electrode and the drain electrode through the via.

In some embodiments, the array substrate further includes:

a thin film transistor, wherein the first conductive structure includes a gate electrode of the thin film transistor, and the gate electrode of the thin film transistor includes the first connection portion;

the second conductive structure includes a gate line having the second connection portion; and the first connection portion of the gate electrode is electrically coupled to the second connection portion of the gate line through the via.

In some embodiments, the orthographic projection of the via on the substrate is within orthographic projections of the first connection portion and the second connection portion on the substrate.

Embodiments of the present disclosure also provide a display panel including the array substrate described above.

In some embodiments, the display panel further includes: a color filter substrate opposite to the array substrate, wherein the array substrate and the color filter substrate are assembled using an adhesive.

In some embodiments, the adhesive includes an ultraviolet curing adhesive.

Embodiments of the present disclosure also provide a display device including the display panel described above.

Embodiments of the present disclosure also provide a method for manufacturing an array substrate, including:

depositing a first conductive structure layer on a substrate;

patterning the first conductive structure layer to form a first conductive structure including a first connection portion provided with a first opening;

depositing a preliminary interlayer insulation layer on the first conductive structure;

patterning the preliminary interlayer insulation layer to form an interlayer insulation layer penetrated through by a via;

depositing a second conductive structure layer on the interlayer insulation layer;

patterning the second conductive structure layer to form a second conductive structure including a second connection portion, wherein the second connection portion is electrically coupled to the first connection portion through the via; and an orthographic projection of the first opening on the substrate does not overlap an orthographic projection of the via on the substrate.

In some embodiments, the patterning the second conductive structure layer to form the second conductive structure including the second connection portion includes: patterning the second conductive structure layer to form the second conductive structure including the second connection portion provided with a second opening.

DETAILED DESCRIPTION

In order to enable those skilled in the art to better understand the technical solutions of the present disclosure, the present disclosure will be further described in detail below with reference to the accompanying drawings and specific embodiments.

Unless defined otherwise, technical or scientific terms used herein shall have ordinary meanings as understood by one of ordinary skill in the art to which the present disclosure belongs. Terms "first", "second", and the like, as used in the present disclosure, do not denote order, quantity, or importance, but are only used to distinguish one element from another. Also, terms "a", "an", "the", or the like, as used in the present disclosure, do not denote quantity, but only denote the presence of at least one. Terms "include", "comprise", or the like, as used in the present disclosure, mean that an element or component appearing before the terms encompasses an element(s) or component(s) appearing after the terms, without excluding other elements or components. Terms "couple to", "connect to", or the like, as used in the present disclosure, are not limited to physical or mechanical connections, and may include direct or indirect electrical connections. Terms "upper", "lower", "left", "right", or the like, as used in the present disclosure, are only used to indicate relative position, and when absolute position of an object being described is changed, the relative position may be changed accordingly.

Figure 1:
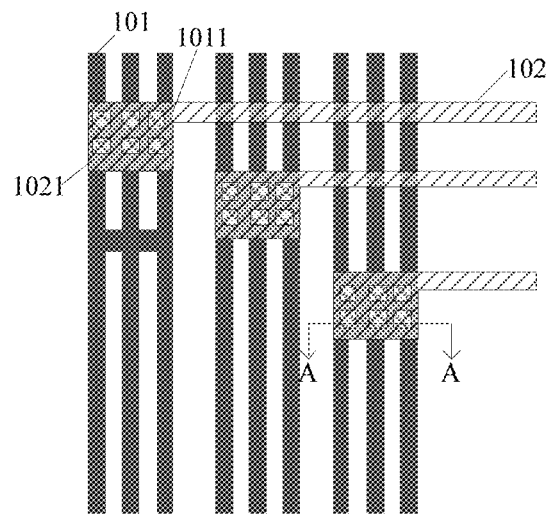
FIG. 1 is a schematic structural view of an array substrate according to a comparative example.
Figure 2:
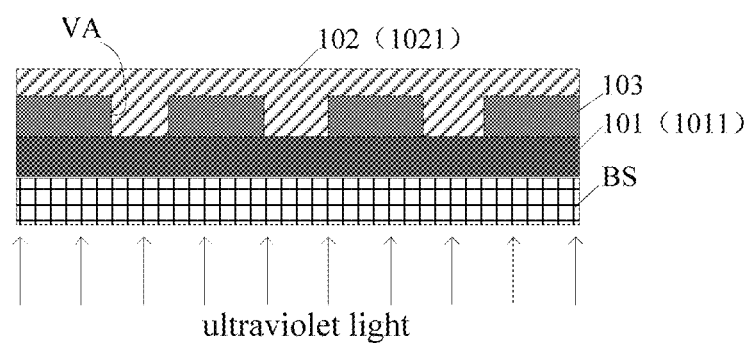
FIG. 2 is a schematic cross-sectional view of the array substrate shown in FIG. 1 taken along line A-A.

FIG. 1 is a schematic structural view of an array substrate according to a comparative example. FIG. 2 is a schematic cross-sectional view of the array substrate shown in FIG. 1 taken along line A-A As shown in FIGS. 1 and 2, the array substrate according to the comparative example includes: a substrate BS, and a first conductive structure 101, an interlayer insulation layer 103, and a second conductive structure 102 sequentially disposed on the substrate BS. A signal may be transmitted between the first conductive structure 101 and the second conductive structure 102, and the first conductive structure 101 and the second conductive structure 102 are typically coupled to each other through a via penetrating through the interlayer insulation layer 103 in a direction perpendicular to the substrate BS. A plurality of slits may be formed in the first conductive structure 101 to ensure that the first conductive structure 101 has a well light transmittance. Similarly, a plurality of slits may also be formed in the second conductive structure 102. However, in order to ensure that the first conductive structure 101 is well coupled to the second conductive structure 102, the first conductive structure 101 is generally configured to include a first connection portion 1011 as a planar portion having a large area, so as to prevent the via from being formed such that an orthographic projection of the via on the substrate BS does not overlap an orthographic projection of the first conductive structure 101 on the substrate BS due to errors such as manufacturing tolerances. The second conductive structure 102 includes a second connection portion 1021 corresponding to the first connection portion 1011, and the first connection portion 1011 may be electrically coupled to the second connection portion 1021 through the via. As shown in FIGS. 1 and 2, the second connection portion 1021 may include a planar portion, and a portion protruding from the planar portion and extending into the via to be coupled to the first connection portion 1011. As shown in FIG. 2, the planar portions each having a large area reduce the light transmittance of the first conductive structure 101 and the second conductive structure 102. If the planar portions are arranged in a display area of the array substrate, light emitted from a backlight source may be blocked out, which reduces a brightness of the backlight and affects display effect. If the planar portions are arranged in a non-display area of the array substrate, ultraviolet light for ultraviolet curing may be blocked out, an intensity of the ultraviolet light may be weakened, and the ultraviolet curing adhesive irradiated by the ultraviolet light with weakened intensity may be incompletely cured. Therefore, problems such as leakage of liquid crystal, infiltration of external moisture into a LCD panel including the array substrate, and the like may occur.

In order to solve at least one of the above technical problems, embodiments of the present disclosure provide an array substrate, a display panel and a display device. The array substrate, the display panel and the display device provided in the embodiments of the present disclosure will be described in further detail below with reference to the detailed description and the accompanying drawings.

Figure 3:
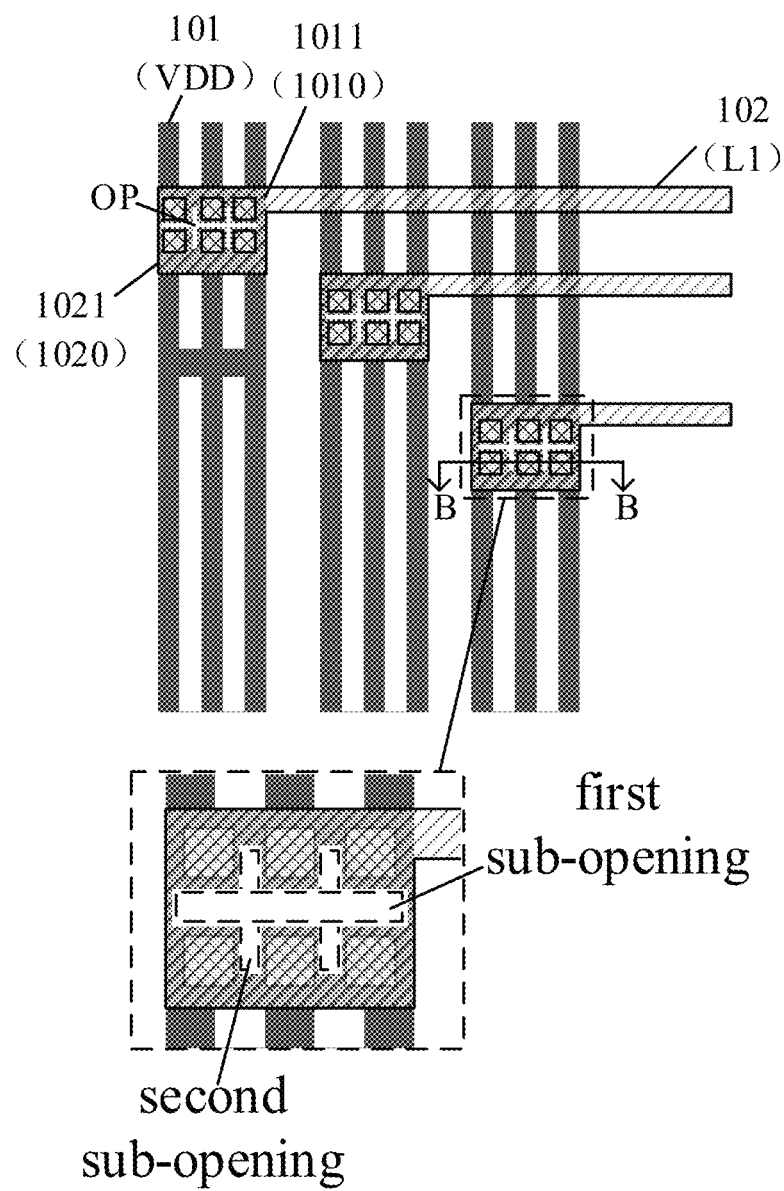
FIG. 3 is a schematic structural view of an array substrate according to an embodiment of the present disclosure.
Figure 4:
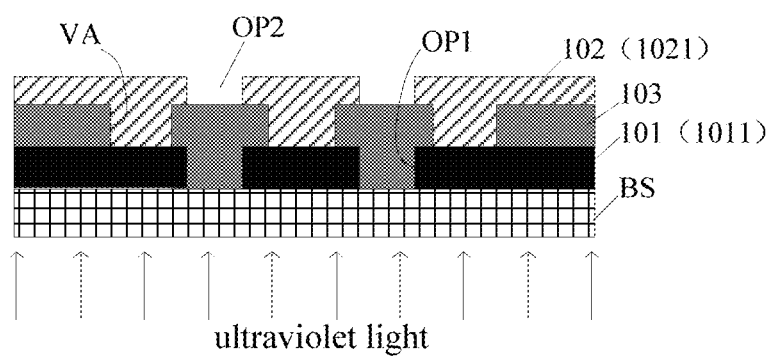
FIG. 4 is a schematic cross-sectional view of the array substrate shown in FIG. 3 taken along line B-B.

FIG. 3 is a schematic structural view of an array substrate according to an embodiment of the present disclosure. FIG. 4 is a schematic cross-sectional view of the array substrate shown in FIG. 3 taken along line B-B.

As shown in FIGS. 3 and 4, the array substrate according to an embodiment of the present disclosure may include: a substrate BS, and a first conductive structure 101, an interlayer insulation layer 103, and a second conductive structure 102 sequentially disposed on the substrate BS. The first conductive structure 101 has a first connection portion 1011, and the second conductive structure 102 has a second connection portion 1021. The first connection portion 1011 may be electrically coupled to the second connection portion 1021 through at least one via VA penetrating through the interlayer insulation layer 103 in a direction perpendicular to the substrate BS. At least one of the first connection portion 1011 and the second connection portion 1021 may be provided with an opening OP, and an orthographic projection of the opening OP on the substrate BS does not overlap an orthographic projection of the via VA on the substrate BS.

In some embodiments, as shown in FIGS. 3 and 4, the opening OP may include a first opening OP1 formed in the first connection portion 1011. In some embodiments, as shown in FIGS. 3 and 4, the opening OP may include a second opening OP2 formed in the second connection portion 1021. In some embodiments, as shown in FIGS. 3 and 4, an orthographic projection of the first opening OP1 on the substrate BS at least partially overlaps an orthographic projection of the second opening OP2 on the substrate BS, but the present disclosure is not limited thereto. For example, in some embodiments, the orthographic projection of the first opening OP1 on the substrate BS may not overlap the orthographic projection of the second opening OP2 on the substrate BS.

In some embodiments, as shown in FIGS. 3 and 4, the first opening OP1 may penetrate through the first connection portion 1011 in a direction perpendicular to the substrate BS, and the second opening OP2 may penetrate through the second connection portion 1021 in the direction perpendicular to the substrate BS, but the present disclosure is not limited thereto.

In some embodiments, as shown in FIGS. 3 and 4, except for the opening OP, shapes of the first connection portion 1011 and the second connection portion 1021 may be substantially the same as shapes of the first connection portion and the second connection portion as shown in FIGS. 1 and 2 to ensure that the via VA is formed such that the orthographic projection of the via VA on the substrate BS overlaps an orthographic projection of the first conductive structure 101 on the substrate BS, so that it can be ensured that the first conductive structure 101 is well coupled to the second conductive structure 102.

In some embodiments, as shown in FIGS. 3 and 4, the orthographic projection of the via VA on the substrate BS overlaps orthographic projections of the first connection portion 1011 and the second connection portion 1021 on the substrate BS. The orthographic projection of the first connection portion 1011 on the substrate BS may overlap the orthographic projection of the second connection portion 1021 on the substrate BS.

It can be understood that, for the sake of clarity, the substrate BS and the interlayer insulation layer 103 are not shown in FIG. 3.

In some embodiments, the first conductive structure 101 and the second conductive structure 102 in the array substrate according to the embodiments of the present disclosure may be applied to various conductive structures that are in different layers of the array substrate and need to be electrically coupled to transmit signals. This will be described in detail in embodiments below.

The first conductive structure 101 may include a single layer, or may include a plurality of layers. In some embodiments, the first conductive structure 101 may be composed of one or more of copper, aluminum, and molybdenum, but the present disclosure is not limited thereto. In some embodiments, the first conductive structure 101 may include, for example, a doped semiconductor material. The second conductive structure 102 may include a single layer, or may include a plurality of layers. In some embodiments, the second conductive structure 102 may be composed of one or more of copper, aluminum, and molybdenum, but the present disclosure is not limited thereto. In some embodiments, the second conductive structure 102 may be composed of a transparent metal oxide such as indium tin oxide or the like. It can be understood that when the second conductive structure 102 is composed of a transparent metal oxide, since light may pass through the second conductive structure 102, the second opening OP2 may not be formed in the second conductive structure 102.

In an embodiment of the present disclosure, the interlayer insulation layer 103 may include an insulating material such as $SiN_x$ (x is an integer greater than or equal to 1), and light such as ultraviolet light may pass through the interlayer insulation layer 103. That is, light such as ultraviolet light is not blocked out by the interlayer insulation layer 103.

In some embodiments, the first conductive structure 101 has the first connection portion 1011, the second conductive structure 102 has the second connection portion 1021, and the first connection portion 1011 is electrically coupled to the second connection portion 1021 through at least one via penetrating through the interlayer insulation layer, so that a signal may be transmitted between the first conductive structure 101 and the second conductive structure 102.

In some embodiments, when viewed in a plan view, the opening OP (for example, the first opening OP1 or the second opening OP2) may have a linear shape. In some embodiments, when viewed in a plan view, the opening OP (for example, the first opening OP1 or the second opening OP2) may have a shape in which the opening OP includes at least one linear-shaped opening extending in a first direction and at least one linear-shaped opening extending in a second direction and intersecting the at least one linear-shaped opening extending in the first direction. For example, in the embodiment shown in FIG. 3, when viewed in a plan view, the opening OP has a shape in which the opening OP includes one linear-shaped opening extending in the first direction and two linear-shaped openings extending in the second direction and intersecting the one linear-shaped opening extending in the first direction. Accordingly, the opening OP may improve the light transmittance of the first connection portion 1011 and/or the second connection portion 1021, while allowing remaining portions of the first connection portion 1011 and/or the second connection portion 1021 other than the opening OP to be coupled to each other.

In some embodiments, an area of the first opening OP1 may be greater than or equal to 30% of an area of the first connection portion 1011, so that the first connection portion has a good light transmittance. In some embodiments, an area of the second opening OP2 may be greater than or equal to 30% of an area of the second connection portion 1021, so that the second connection portion has a good light transmittance.

It is to be understood that the shape and area of the opening in the present disclosure are not limited to the above-described embodiments, and the light transmittance of the array substrate may be improved as long as at least one of the first and second connection portions is provided with the opening.

In the array substrate according to the embodiments of the present disclosure, since the first conductive structure 101 has the first connection portion 1011, it may be ensured that the via is formed such that the orthographic projection of the via on the substrate BS overlaps the orthographic projection of the first connection portion 1011 on the substrate BS. The second connection portion of the second conductive structure 102 is coupled to the first connection portion 1011 through the via, so that the first conductive structure 101 can be stably coupled to the second conductive structure 102, and thus the signal can be stably transmitted therebetween. Since at least one of the first connection portion 1011 and the second connection portion 1021 is provided with an opening, and the orthographic projection of the opening on the substrate does not overlap the orthographic projection of the via on the substrate, the light transmittance of the first connection portion 1011 and/or the second connection portion 1021 can be improved. In the case where the first connection portion and/or the second connection portion including the opening(s) are in a display area of the array substrate, blocking out of light emitted by the backlight source can be reduced or prevented, backlight brightness can be improved, and the display effect can be improved. In the case where the first connection portion and/or the second connection portion including the opening(s) are in a non-display area of the array substrate, blocking out of ultraviolet light for curing may be reduced or prevented, and the intensity of the ultraviolet light can be increased, so that the ultraviolet curing adhesive for sealing can be completely cured. Therefore, the problems such as leakage of liquid crystal, infiltration of external moisture into the LCD panel, and the like can be prevented.

In some embodiments, as shown in FIGS. 3 and 4, the at least one via VA includes a plurality of vias VA, and the interlayer insulation layer 103 may be penetrated through by the plurality of vias VA. In some embodiments, as shown in FIGS. 3 and 4, the first connection portion 1011 may include a plurality of first sub-connection portions 1010 coupled to each other, the first opening OP1 may be between any adjacent ones of the plurality of first sub-connection portions 1010, and each of the plurality of first sub-connection portions 1010 may be electrically coupled to the second connection portion 1021 through a corresponding via VA of the plurality of vias VA. In some embodiments, as shown in FIGS. 3 and 4, the second connection portion 1021 may include a plurality of second sub-connection portions 1020 coupled to each other, the second opening OP2 may be between any adjacent ones of the plurality of second sub-connection portions 1020, and each of the plurality of second sub-connection portions 1020 may be electrically coupled to the first connection portion 1011 through a corresponding via VA of the plurality of vias VA. In some embodiments, as shown in FIGS. 3 and 4, each of the plurality of first sub-connection portions 1010 is electrically coupled to a corresponding one of the plurality of second sub-connection portions 1020 through a corresponding one of the plurality of vias VA. In some embodiments, the plurality of first sub-connection portions 1010, the plurality of second sub-connection portions 1020, and the plurality of vias VA have a one-to-one correspondence.

The first connection portion 1011 may be configured to include a plurality of first sub-connection portions 1010 spaced by the first opening OP1, the first opening OP1 may be between adjacent first sub-connection portions 1010, and each of the first sub-connection portions 1010 may correspond to one of the plurality of vias VA and be coupled to the second connection portion 1021 through the corresponding via. The second connection portion 1021 may be configured to include a plurality of second sub-connection portions 1020 spaced by the second opening OP2, and the second opening OP2 may be between adjacent second sub-connection portions 1020 such that each of the plurality of first sub-connection portion 1010 is electrically coupled to a corresponding second sub-connection portion 1020 through the corresponding via VA. Therefore, the first conductive structure 101 can be well coupled to the second conductive structure 102, and the signal can be stably transmitted therebetween. Meanwhile, light transmittance of the first and second connection portions 1011 and 1021 can be improved. In the case where the first connection portion 1011 and the second connection portion 1021 including the opening(s) are in the display area of the array substrate, blocking out of light emitted by the backlight source can be reduced or prevented, backlight brightness can be improved, and the display effect can be improved. In the case where the first connection portion 1011 and the second connection portion 1021 including the opening(s) are in the non-display area of the array substrate, blocking out of ultraviolet light for curing may be reduced or prevented, and the intensity of the ultraviolet light can be increased, so that the ultraviolet curing adhesive for sealing can be completely cured. Therefore, the problems such as leakage of liquid crystal, infiltration of external moisture into the LCD panel, and the like can be prevented.

In some embodiments, as shown in FIG. 3, the first conductive structure 101 may include a power supply voltage signal line VDD, the second conductive structure 102 may include a first signal connection line L1, the first connection portion 1011 included in the power supply voltage signal line VDD may be electrically coupled to the second connection portion 1021 included in the first signal connection line L1 through the via VA, and the first signal connection line L1 may be electrically coupled to an electrostatic discharge structure (not shown).

In some embodiments, the first conductive structure 101 may be the power supply voltage signal line VDD, and the second conductive structure 102 may be the first signal connection line L1. The power supply voltage signal line VDD may be arranged in the non-display area of the array substrate, be arranged to surround the display area of the array substrate, and be configured to supply a power voltage signal to pixel units in the display area to drive light emitting devices in the pixel units to emit light. In the process of manufacturing and using of the array substrate, static electricity may be generated in a wiring layer of the array substrate. The power supply voltage signal line VDD may be coupled to the electrostatic discharge structure to conduct and discharge the static electricity in the wiring layer of the array substrate. The power supply voltage signal line VDD may be coupled to the electrostatic discharge structure through the first signal connection line L1. Since the power supply voltage signal line VDD may be in a different layer from the first signal connection line L1, the power supply voltage signal line VDD may be coupled to the first signal connection line L1 by forming the via.

Since the power supply voltage signal line VDD has the first connection portion 1011, it may be ensured that the via is formed such that the orthographic projection of the via on the substrate BS overlaps the orthographic projection of the first connection portion 1011 of the power supply voltage signal line VDD on the substrate BS. The first signal connection line L1 has the second connection portion 1021, and the first connection portion 1011 is coupled to the second connection portion 1021 through the via, so that the power supply voltage signal line VDD can be stably coupled to the first signal connection line L1, and thus a signal can be stably transmitted therebetween. Since at least one of the first connection portion 1011 and the second connection portion 1021 is provided with an opening, blocking out of ultraviolet light for curing may be reduced or prevented, and the intensity of the ultraviolet light can be increased, so that the ultraviolet curing adhesive for sealing can be completely cured. Therefore, the problems such as leakage of liquid crystal, infiltration of external moisture into the LCD panel, and the like can be prevented.

Figure 5:
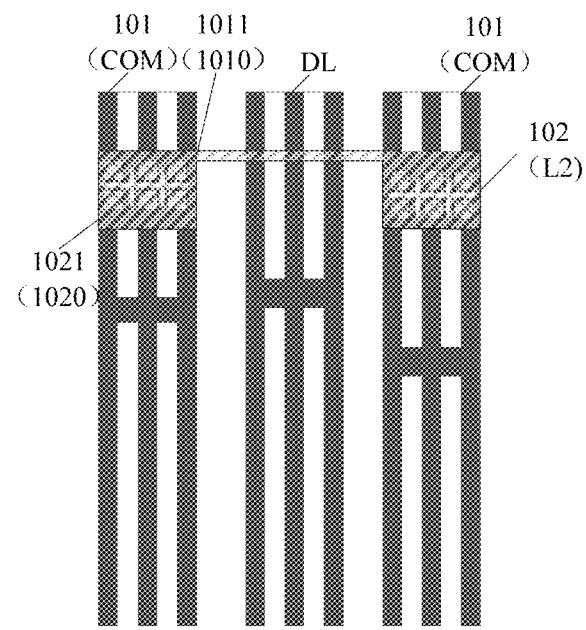
FIG. 5 is a schematic structural view of an array substrate according to another embodiment of the present disclosure.

FIG. 5 is a schematic structural view of an array substrate according to another embodiment of the present disclosure.

As shown in FIG. 5, the first conductive structure 101 may include a common electrode line COM, and the second conductive structure 102 may include a second signal connection line L2. The first connection portion 1011 included in the common electrode line COM may be electrically coupled to the second connection portion 1021 included in the second signal connection line L2 through the via.

The array substrate may include a plurality of common electrode lines COM and a plurality of data lines DL, the common electrode lines COM may be alternately arranged with the data lines DL along a direction, and the common electrode lines COM and the data lines DL are in a same layer. Since a common signal, which is a constant voltage signal, is input into the common electrode line COM, and the common electrode lines COM in the same array substrate are input with the same common signal, the common electrode lines COM are electrically coupled to each other so as to receive the same common signal. In order to avoid short circuit between the common electrode lines COM and the data lines DL in the same layer, the common electrode lines COM may be coupled through the second signal connection line L2. Since the common electrode lines COM are in a different layer from the second signal connection line L2, the common electrode lines COM may be coupled to the second signal connection line L2 by forming the via.

Since the common electrode line COM has the first connection portion 1011, it may be ensured that the via is formed such that the orthographic projection of the via on the substrate BS overlaps the orthographic projection of the first connection portion 1011 of the common electrode line COM on the substrate BS. The second signal connection line L2 has the second connection portion 1021, and the first connection portion 1011 is coupled to the second connection portion 1021 through the via, so that the common electrode line COM can be stably coupled to the second signal connection line L2, and thus a signal can be stably transmitted therebetween. Since at least one of the first connection portion 1011 and the second connection portion 1021 is provided with an opening, the light transmittance of the first connection portion 1011 and/or the second connection portion 1021 can be improved. In the case where the first connection portion 1011 and/or the second connection portion 1021 including the opening(s) are in the display area of the array substrate, blocking out of light emitted by the backlight source can be reduced or prevented, backlight brightness can be improved, and the display effect can be improved.

In some embodiments, the array substrate according to an embodiment of the present disclosure may further include a thin film transistor. In this case, the first conductive structure 101 may include an active layer of the thin film transistor, the second conductive structure 102 may include a source electrode and a drain electrode of the thin film transistor, and the first connection portion 1011 included in the active layer may be electrically coupled to the second connection portion 1021 included in each of the source electrode and the drain electrode through the via. In some embodiments, the first connection portion 1011 of the active layer may be electrically coupled to the second connection portions 1021 of the source electrode and the drain electrode through corresponding vias, respectively.

In some embodiments, the first conductive structure 101 may be the active layer of the thin film transistor, the second conductive structure 102 may be the source electrode and the drain electrode of the thin film transistor, the active layer may have the first connection portion 1011, each of the source electrode and the drain electrode may have the second connection portion 1021, and the first connection portion 1011 may be coupled to the second connection portion 1021 through the via, so that the active layer may be stably coupled to the source electrode and the drain electrode, and thus signals may be stably transmitted between the active layer and the source electrode and the drain electrode. Since at least one of the first connection portion 1011 and the second connection portion 1021 is provided with an opening, the light transmittance of the first connection portion 1011 and/or the second connection portion 1021 can be improved. In the case where the first connection portion 1011 and/or the second connection portion 1021 including the opening(s) are in the display area of the array substrate, blocking out of light emitted by the backlight source can be reduced or prevented, backlight brightness can be improved, and the display effect can be improved. In the case where the first connection portion 1011 and/or the second connection portion 1021 including the opening(s) are in the non-display area of the array substrate, blocking out of ultraviolet light for curing may be reduced or prevented, and the intensity of the ultraviolet light can be increased, so that the ultraviolet curing adhesive for sealing can be completely cured. Therefore, the problems such as leakage of liquid crystal, infiltration of external moisture into the LCD panel, and the like can be prevented.

In some embodiments, the array substrate according to an embodiment of the present disclosure may further include a thin film transistor. In this case, the first conductive structure 101 may include a gate electrode of the thin film transistor, the second conductive structure 102 may include a gate line, and the first connection portion 1011 included in the gate electrode may be electrically coupled to the second connection portion 1021 included in the gate line through the via.

In the array substrate according to the embodiments of the present disclosure, the thin film transistor may be a switch transistor or a driving transistor. Each of the electrodes of the thin film transistor in the array substrate needs to be coupled to a corresponding signal line. For example, the gate electrode of the switch transistor needs to be coupled to the gate line. Accordingly, the gate electrode of the switch transistor may be coupled to the gate line through the via.

Since the gate electrode has the first connection portion 1011, it may be ensured that the via is formed such that the orthographic projection of the via on the substrate BS overlaps the orthographic projection of the first connection portion 1011 of the gate electrode on the substrate BS. The gate line has the second connection portion 1021, and the first connection portion 1011 is coupled to the second connection portion 1021 through the via, so that gate electrode can be stably coupled to the gate line, and thus a signal can be stably transmitted therebetween. Since at least one of the first connection portion 1011 and the second connection portion 1021 is provided with an opening, the light transmittance of the first connection portion 1011 and/or the second connection portion 1021 can be improved. In the case where the first connection portion 1011 and/or the second connection portion 1021 including the opening(s) are in the display area of the array substrate, blocking out of light emitted by the backlight source can be reduced or prevented, backlight brightness can be improved, and the display effect can be improved. In the case where the first connection portion 1011 and/or the second connection portion 1021 including the opening(s) are in the non-display area of the array substrate, blocking out of ultraviolet light for curing may be reduced or prevented, and the intensity of the ultraviolet light can be increased, so that the ultraviolet curing adhesive for sealing can be completely cured. Therefore, the problems such as leakage of liquid crystal, infiltration of external moisture into the LCD panel, and the like can be prevented. It is understood that other electrodes of the thin film transistor may also be coupled to the corresponding signal lines through corresponding vias.

In some embodiments, as described above, the orthographic projection of the via on the substrate is within the orthographic projections of the first connection portion 1011 and the second connection portion 1021 on the substrate.

In the array substrate according to the embodiments of the present disclosure, the first conductive structure 101 may include the first connection portion 1011 which is formed by forming an opening in a planar portion having a large area, and the second conductive structure 102 may include the second connection portion 1021 corresponding to the first connection portion 1011 to ensure that the via is formed such that the orthographic projection of the via on the substrate BS overlaps the orthographic projection of the first connection portion 1011 on the substrate BS, so that it can be ensured that the first conductive structure 101 is well coupled to the second conductive structure 102.

Figure 6:
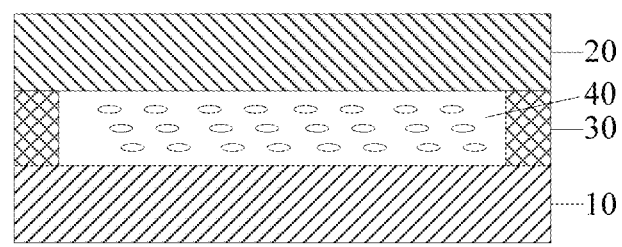
FIG. 6 is a schematic structural view of a display panel according to an embodiment of the present disclosure.

FIG. 6 is a schematic structural view of a display panel according to an embodiment of the present disclosure.

As shown in FIG. 6, the display panel according to an embodiment of the present disclosure includes the array substrate 10 according to any one of the above embodiments, a color filter substrate 20 opposite to the array substrate 10, and a liquid crystal layer 40 between the array substrate 10 and the color filter substrate 20. The array substrate 10 and the color filter substrate 20 are assembled using an adhesive 30. In some embodiments, the adhesive 30 may include an ultraviolet curing adhesive. The liquid crystal layer 40 includes liquid crystal molecules.

In the array substrate 10 of the display panel according to the embodiments of the present disclosure, since the first conductive structure 101 has the first connection portion 1011, it may be ensured that the via is formed such that the orthographic projection of the via on the substrate BS overlaps the orthographic projection of the first connection portion 1011 of the first conductive structure 101 on the substrate BS. The second conductive structure 102 has the second connection portion 1021, the second connection portion 1021 is coupled to the first connection portion 1011 through the via, so that the first conductive structure 101 can be stably coupled to the second conductive structure 102, and thus a signal can be stably transmitted therebetween. Since at least one of the first connection portion 1011 and the second connection portion 1021 is provided with an opening, and the orthographic projection of the opening on the substrate does not overlap the orthographic projection of the via on the substrate, the light transmittance of the first connection portion 1011 and/or the second connection portion 1021 can be improved. In the case where the first connection portion 1011 and/or the second connection portion 1021 including the opening(s) are in the display area of the array substrate 10, blocking out of light emitted by the backlight source can be reduced or prevented, backlight brightness can be improved, and the display effect can be improved. In the case where the first connection portion 1011 and/or the second connection portion 1021 including the opening(s) are in the non-display area of the array substrate 10, blocking out of ultraviolet light for curing may be reduced or prevented, and the intensity of the ultraviolet light can be increased, so that the ultraviolet curing adhesive for sealing can be completely cured. Therefore, the problems such as leakage of liquid crystal, infiltration of external moisture into the LCD panel, and the like can be prevented.

An embodiment of the present disclosure further provides a display device. The display device may include an electronic device having a display panel, such as a mobile phone, a tablet computer, an electronic watch, a sports bracelet, and a notebook computer, and the display panel of the display device may be the display panel according to any one of the above embodiments of the present disclosure.

Figure 7:
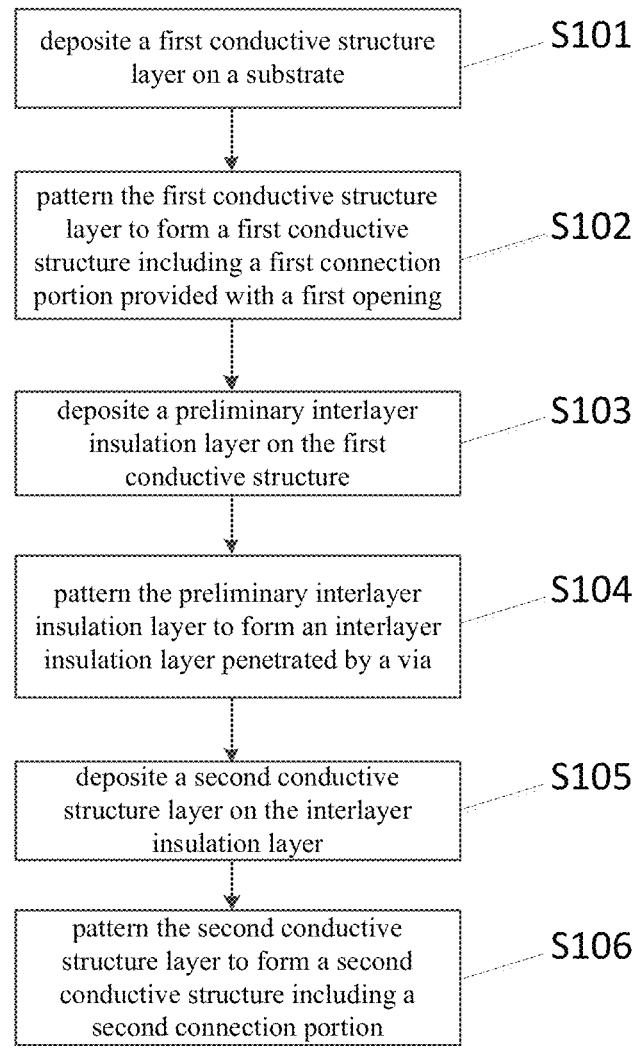
FIG. 7 is a flowchart illustrating a method for manufacturing an array substrate according to an embodiment of the present disclosure.

FIG. 7 is a flowchart illustrating a method for manufacturing an array substrate according to an embodiment of the present disclosure. The method may include following steps S101 to S106.

In step S101, a first conductive structure layer is deposited on a substrate.

In step S102, the first conductive structure layer is patterned to form a first conductive structure including a first connection portion. In some embodiments, the first connection portion is formed to be provided with a first opening.

In step S103, a preliminary interlayer insulation layer is deposited on the first conductive structure.

In step S104, the preliminary interlayer insulation layer is patterned to form an interlayer insulation layer penetrated through by a via.

In step S105, a second conductive structure layer is deposited on the interlayer insulation layer.

In step S106, the second conductive structure layer is patterned to form a second conductive structure including a second connection portion electrically coupled to the first connection portion through the via. In some embodiments, the second connection portion is formed to be provided with a second opening.

In an embodiment of the present disclosure, an orthographic projection of the first opening or the second opening on the substrate does not overlap an orthographic projection of the via on the substrate.

In the embodiments of the present disclosure, patterning an element may include patterning the element using any suitable patterning process known to those skilled in the art.

For example, the patterning process may include a photolithography process, a wet etching process, a dry etching process, or the like.

It will be appreciated that the above embodiments are merely exemplary embodiments for the purpose of illustrating the principle of the disclosure, and the present disclosure is not limited thereto. Various modifications and improvements can be made by a person having ordinary skill in the art without departing from the spirit and essence of the present disclosure. Accordingly, all of the modifications and improvements also fall into the protection scope of the present disclosure.

What is claimed is:

1. An array substrate, comprising:
a substrate; and
a first conductive structure, an interlayer insulation layer, and a second conductive structure sequentially disposed on the substrate,
wherein the first conductive structure has a first connection portion, the second conductive structure has a second connection portion, and the first connection portion is electrically coupled to the second connection portion through at least one via penetrating through the interlayer insulation layer;
at least one of the first connection portion and the second connection portion is provided with an opening, and an orthographic projection of the opening on the substrate does not overlap an orthographic projection of the via on the substrate; and
the opening has at least one linear-shaped first sub-opening extending in a first direction parallel to the substrate and at least one linear-shaped second sub-opening extending in a second direction parallel to the substrate and intersecting the first direction.

2. The array substrate of claim 1, wherein
the first connection portion comprises a plurality of first sub-connection portions coupled to each other, and the opening is between any adjacent ones of the plurality of first sub-connection portions;
the at least one via comprises a plurality of vias; and
each of the plurality of first sub-connection portions is electrically coupled to the second connection portion through a corresponding one of the plurality of vias.

3. The array substrate of claim 1, wherein
the second connection portion comprises a plurality of second sub-connection portions coupled to each other, and the opening is between any adjacent ones of the plurality of second sub-connection portions;
the at least one via comprises a plurality of vias; and
each of the plurality of second sub-connection portions is electrically coupled to the first connection portion through a corresponding one of the plurality of vias.

4. The array substrate of claim 1, wherein
the first connection portion comprises a plurality of first sub-connection portions coupled to each other;
the second connection portion comprises a plurality of second sub-connection portions coupled to each other;
the opening comprises a first opening between any adjacent ones of the plurality of first sub-connection portions and a second opening between any adjacent ones of the plurality of second sub-connection portions;
the at least one via comprises a plurality of vias; and
each of the plurality of first sub-connection portions is electrically coupled to a corresponding one of the plurality of second sub-connections through a corresponding via of the plurality of vias.

5. The array substrate of claim 1, wherein
the first conductive structure comprises a power supply voltage signal line having the first connection portion;
the second conductive structure comprises a first signal connection line having the second connection portion; and
the first connection portion of the power supply voltage signal line is electrically coupled to the second connection portion of the first signal connection line through the via, and the first signal connection line is electrically coupled to an electrostatic discharge structure.

6. The array substrate of claim 1, wherein
the first conductive structure comprises a common electrode line having the first connection portion;
the second conductive structure comprises a second signal connection line having the second connection portion; and
the first connection portion of the common electrode line is electrically coupled to the second connection portion of the second signal connection line through the via.

7. The array substrate of claim 1, further comprising:
a thin film transistor,
wherein the first conductive structure comprises an active layer of the thin film transistor, and the active layer of the thin film transistor comprises the first connection portion;
the second conductive structure comprises a source electrode and a drain electrode of the thin film transistor, and each of the source electrode and the drain electrode of the thin film transistor comprises the second connection portion; and
the first connection portion of the active layer is electrically coupled to the second connection portion of each of the source electrode and the drain electrode through the via.

8. The array substrate of claim 1, further comprising:
a thin film transistor,
wherein the first conductive structure comprises a gate electrode of the thin film transistor, and the gate electrode of the thin film transistor comprises the first connection portion;
the second conductive structure comprises a gate line having the second connection portion; and
the first connection portion of the gate electrode is electrically coupled to the second connection portion of the gate line through the via.

9. The array substrate of claim 1, wherein the orthographic projection of the via on the substrate is within orthographic projections of the first connection portion and the second connection portion on the substrate.

10. A display panel, comprising the array substrate of claim 1.

11. The display panel of claim 10, further comprising:
a color filter substrate opposite to the array substrate,
wherein the array substrate and the color filter substrate are assembled using an adhesive.

12. The display panel of claim 11, wherein the adhesive comprises an ultraviolet curing adhesive.

13. A display device, comprising the display panel of claim 10.

14. A method for manufacturing an array substrate, comprising:
depositing a first conductive structure layer on a substrate;
patterning the first conductive structure layer to form a first conductive structure comprising a first connection portion provided with a first opening;

depositing a preliminary interlayer insulation layer on the first conductive structure;

patterning the preliminary interlayer insulation layer to form an interlayer insulation layer penetrated through by a via;

depositing a second conductive structure layer on the interlayer insulation layer;

patterning the second conductive structure layer to form a second conductive structure comprising a second connection portion, wherein the second connection portion is electrically coupled to the first connection portion through the via;

an orthographic projection of the first opening on the substrate does not overlap an orthographic projection of the via on the substrate; and the first opening has at least one linear-shaped first sub-opening extending in a first direction parallel to the substrate and at least one linear-shaped second sub-opening extending in a second direction parallel to the substrate and intersecting the first direction.

15. The method of claim 14, wherein the patterning the second conductive structure layer to form the second conductive structure comprising the second connection portion comprises: patterning the second conductive structure layer to form the second conductive structure comprising the second connection portion provided with a second opening.

* * * * *